United States Patent [19]

Carlton

[11] Patent Number: 4,719,408
[45] Date of Patent: Jan. 12, 1988

[54] APPARATUS FOR INDICATING PROPER COMPENSATION OF AN ADJUSTABLE FREQUENCY COMPENSATION NETWORK

[75] Inventor: Dale E. Carlton, Portland, Oreg.
[73] Assignee: Tektronix, Inc., Beaverton, Oreg.
[21] Appl. No.: 812,481
[22] Filed: Dec. 23, 1985
[51] Int. Cl.$^4$ .............. G01R 27/28; H03L 5/00; H03K 5/00
[52] U.S. Cl. .................. 324/57 PS; 328/148; 328/162
[58] Field of Search ............ 324/57 PS, 57 R, 98, 324/99 R, 99 D; 328/148, 162; 307/358

[56] References Cited

U.S. PATENT DOCUMENTS

| | | | |
|---|---|---|---|
| 4,070,615 | 1/1978 | Crop | 324/57 R |
| 4,091,381 | 5/1978 | Huntsinger | 324/98 X |
| 4,253,057 | 2/1981 | Carlton et al. | 324/57 PS |
| 4,490,713 | 12/1984 | Mrozowski et al. | 324/99 D X |

Primary Examiner—Reinhard J. Eisenzopf
Assistant Examiner—Jack B. Harvey
Attorney, Agent, or Firm—John Smith-Hill

[57] ABSTRACT

Apparatus for indicating proper compensation of an adjustable frequency compensation network comprises a signal source operable to apply a rectangular pulse train having a preselected peak magnitude to the frequency compensation network, and a peak detector circuit for comparing the output voltage of the frequency compensation network to at least one threshold value. The peak detector circuit is used to determine whether, at a time that follows a transition of a pulse of the pulse train by an interval that is less than one time constant of the frequency compensation network, the output voltage of the frequency compensation network bears a predetermined relationship to the threshold value.

9 Claims, 2 Drawing Figures

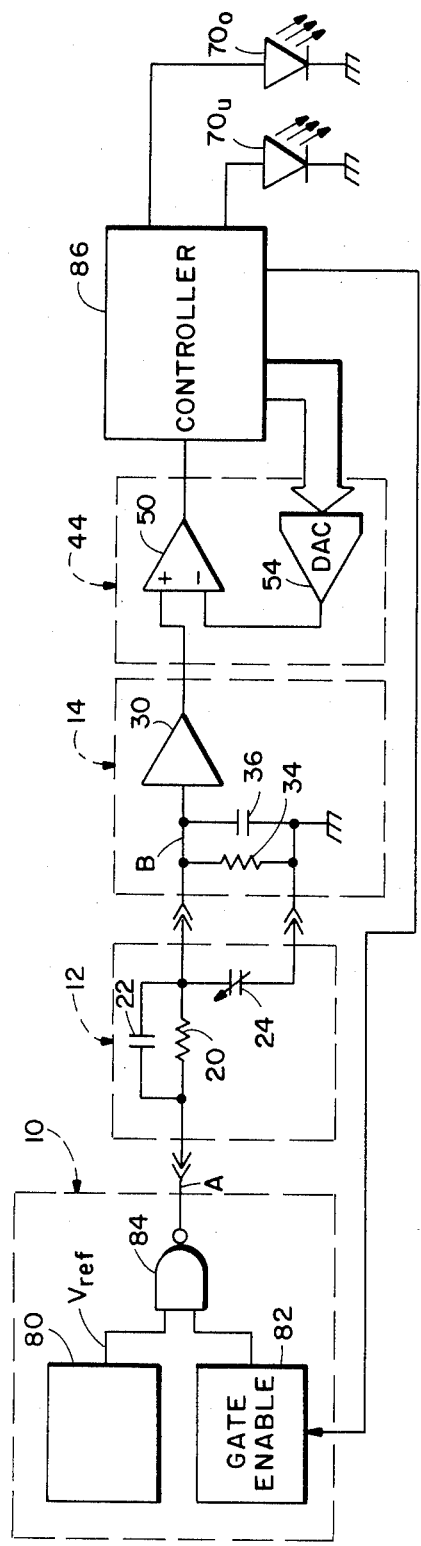
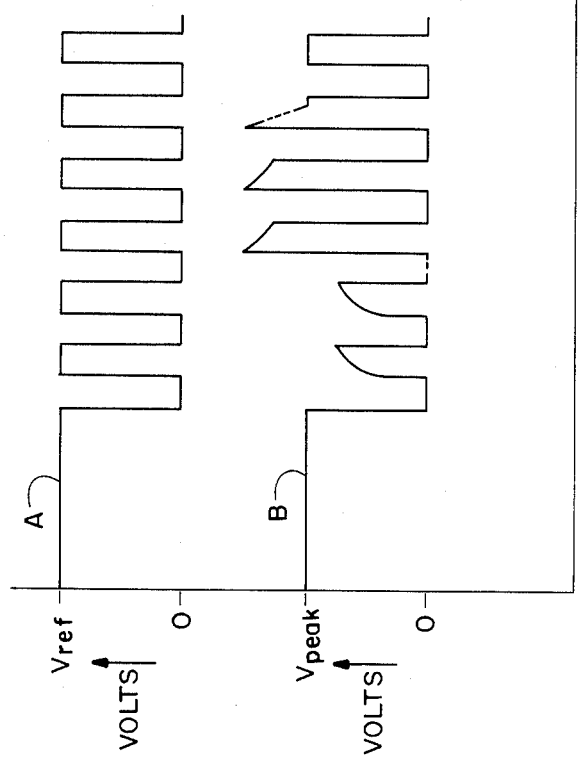
FIG. 1
FIG. 2

APPARATUS FOR INDICATING PROPER COMPENSATION OF AN ADJUSTABLE FREQUENCY COMPENSATION NETWORK

This invention relates to apparatus for indicating proper compensation of an adjustable frequency compensation network, particularly, but not exclusively, an attenuation probe network for an oscilloscope.

BACKGROUND OF THE INVENTION

Attenuation probes are generally associated with oscilloscopes; however, they may be used as a means for coupling an input signal to any electronic test and measurement instrument.

An attenuator probe network typically comprises two resistors connected in series between the probe tip and ground, the resistance values of the resistors being in a predetermined ratio, and two capacitors connected in parallel with the two resistors respectively. The output of the probe is taken from the junction point of the resistors. Therefore, one of the resistors is connected in series between the probe tip and the probe's output terminal and the other resistor is a shunt resistor. Similarly, the capacitors comprise a series capacitor and a shunt capacitor. The ratio of the resistance values of the resistors establishes the DC attenuation factor of the network whereas the AC performance of the network is governed by the capacitance values of the capacitors. The impedance of a capacitor is frequency dependent, and therefore it is necessary to adjust the relative capacitance values of the probe network to provide a constant attenuation factor over the frequency range of the signals of interest. The operation of adjusting the relative capacitance values of the capacitors of an attenuation probe is known as compensation. An apparatus for indicating proper compensation of an adjustable attenuation probe network is described in U.S. Pat. No. 4,253,057. In the case of U.S. Pat. No. 4,253,057, the series resistor and the series capacitor are incorporated in the probe itself, while the shunt resistor is part of the instrument's input amplifier stage. The shunt capacitor comprises a fixed capacitor in the input amplifier stage and a variable capacitor in the probe itself. The apparatus described in U.S. Pat. No. 4,253,057 operates by applying a square wave signal to the probe network and comparing the peak value of the signal at the output terminal of the Probe network with a previously-detected and stored reference value.

A disadvantage of a Practical implementation of the apparatus described in U.S. Pat. No. 4,253,057 is that it is necessary for the operator to adjust the variable capacitor to its minimum capacitance value prior to making the final adjustment, because the adjustment must be made from the undercompensated state. Moreover, owing to charge redistribution when the compensation capacitor is adjusted, an erroneous voltage may be developed across the compensation capacitor, giving rise to false indications of compensation. Further, the stored reference value is detected by adjusting the compensation capacitor to the undercompensated state, and the reference value is subject to error due to the possibility of the voltage developed across the compensation capacitor being erroneous.

SUMMARY OF THE INVENTION

In a preferred embodiment of the invention, apparatus for indicating proper compensation of an adjustable frequency compensation network having a predetermined time constant comprises a source of a constant reference voltage. A gate has its input terminal connected to the source. The output terminal of the gate is connected to the frequency compensation network, and the gate also has an enable terminal connected to a gate enable circuit. In a first mode of operation of the gate enable circuit, the reference voltage that is applied to the input terminal of the gate is conducted to the output terminal and is applied to the compensation network for an interval that is substantially longer than the time constant of the frequency compensation network. In a second mode of operation of the gate enable circuit, the gate is alternately enabled and disabled, so that the reference voltage is applied intermittently to the frequency compensation network. The duration of the interval during which the reference voltage is applied to the frequency compensation network in the second mode is less than the time constant of the frequency compensation network. The peak output voltage of the frequency compensation network during the interval for which the reference voltage is applied to the compensation network is equal to the output voltage in the first mode of operation only if the frequency compensation network is properly adjusted.

BRIEF DESCRIPTION OF THE DRAWING

For a better understanding of the invention, and to show how the same may be carried into effect, reference will now be made, by way of example, to the accompanying drawing in which:

FIG. 1 is a block diagram of apparatus embodying the present invention, and

FIG. 2 shows waveforms useful in explaining operation of the FIG. 1 apparatus.

DETAILED DESCRIPTION

FIG. 1 shows an attenuation probe 12 that is connected to an input buffer amplifier stage 14 of an electronic instrument, other details of which are not shown. For the purpose of determining proper compensation of the probe 12, the output of the amplifier stage 12 is connected to a peak detector circuit 44. Signals for use in adjusting the compensation of the probe 12 are applied to the probe tip from a signal source 10.

The input buffer amplifier stage 14 comprise an amplifier 30. The input impedance of the amplifier stage 14 is established by the parallel combination of a shunt resistor 34 and a shunt capacitor 36. The resistor 34 may, for example, be a 1 megohm resistor, and the value of the capacitor 36 is chosen to provide a predetermined input time constant. Generally, the value of the capacitor 36 is small. In conventional instruments, the capacitor 36 has a value of 15 or 20 pF.

The attenuation probe 12 comprises a series resistor 20, a fixed series capacitor 22 and a variable shunt capacitor 24. The value of the resistor 20 is chosen to provide the proper voltage divider ratio in conjunction with the shunt resistor 34. For example, if it is desired that the probe 12 have an attenuation ratio of 10:1, so that its output voltage is one-tenth of its input voltage, age, the resistance value of the series resistor 20 is nine times that of the shunt resistor 34. The time constant of the probe 12 should be matched to the time constant of the input buffer amplifier stage 14 in order to provide a flat frequency response so that a signal that is passed through the probe is not distorted because of variation in attenuation factor with signal frequency. Proper matching is achieved by establishing the appropriate capacitance divider ratio for the values of the capacitors 22 and 24, in conjunction with the value of the capacitor 36.

The signal source 10 comprises a circuit 80 that provides a DC output voltage $V_{ref}$, a gate enable circuit 82, and a NAND gate 84. The value of the DC output voltage need not be established with precision: it is necessary only that the voltage be stable with time, so that it does not vary during the compensation operation. The gate enable circuit 82 has two operating modes, and is placed in one mode or the other in dependence on a control signal provided by a controller 86. In the first operating mode (from time $t_0$ to time $t_1$ in FIG. 2), the gate enable circuit 82 provides a constant output at logic level 0, and the NAND gate 84 provides a constant DC voltage level $V_{ref}$ at its output (waveform A). This voltage is applied to the probe 12, and results in application to the input terminal of the amplifier 20 of a constant voltage $V_{peak}$ (waveform B). Because the voltage $V_{ref}$ is constant, the value of $V_{peak}$ is determined by the ratio of the resistors 20 and 34, and is not affected by the capacitors 22, 24 and 36. The output voltage of the amplifier 30 is applied to the peak detector 44.

The peak detector 44 comprises a comparator 50 which receives the output signal from the amplifier 30, and a digital-to-analog converter (DAC) 54. The DAC 54 receives digital signals from the controller 86 and generates therefrom an analog voltage that is applied to the threshold input of the comparator. The comparator 30 provides an output signal to the controller 86 that is at logical zero if the voltage of the input signal received from the amplifier 30 is below the threshold voltage provided by the DAC 54, at logical one if the voltage of the input signal is above the threshold voltage, and oscillates between logical zero and logical one if the input signal voltage is equal to the threshold voltage. The controller 86 causes the lamp $70_u$ or $70_o$ to be illuminated depending on whether the comparator provides a logical zero or logical one output signal. If the output signal of the comparator oscillates, both lamps are illuminated. Therefore, the lamps provide a visual indication as to the nature of the signal received from the comparator.

In the first mode of operation, the controller 86 causes the threshold voltage to increase monotonically until the output signal of the comparator oscillates, indicating that the input signal voltage is equal to the threshold voltage. In fact, there will be a range of values of the input signal voltage over which the output signal of the comparator oscillates, and the size of this range depends on the sensitivity of the comparator. This range of values provides a window function. The controller responds to oscillation of the comparator's output signal by latching the digital signal applied to the DAC 54, and accordingly the threshold voltage then remains constant. In addition, the controller 86 switches the signal source 10 to its second operating mode (beyond time $t_1$ in FIG. 2). In this mode, the gate enable circuit 82 generates alternate high and low logic levels, so that the output voltage of the circuit 80 is chopped by the NAND gate 84. The voltage $V_{ref}$ is thus applied intermittently to the probe 12, so that the probe network receives a rectangular waveform input signal. The rise and fall times of the rectangular waveform are each about one-fifth to one-tenth of the time constant of the probe network. The period of the output signal of the gate enable circuit 82 and the duty cycle of that signal are selected so that the output signal of the gate 84 remains at the voltage $V_{ref}$ for a time shorter than the time constant of the network comprising the resistors 20 and 34 and the capacitors 22, 24, and 36. This implies that the voltage level at the input of the amplifier 30 cannot attain the value $V_{peak}$ during the active interval (the interval for which the output voltage of the NAND gate 84 is $V_{ref}$) unless the capacitor 24 has the value such that the network is properly compensated. Assuming that only one of the lamps $70_u$ and $70_o$ is illuminated, the operator notes which lamp 70 is illuminated and increases or decreases the capacitance of the capacitor 24, depending on whether the lamp $70_u$ or $7_{-o}$ is illuminated, until both lamps are illuminated, indicating that the probe network is properly compensated.

It will be seen that in the case of the illustrated apparatus it is not necessary to adjust the compensation capacitor 24 in order to generate the threshold voltage that is applied to the comparator in the second mode of operation. Therefore, error in the threshold voltage due to displacement of charge on the capacitor does not arise. Moreover, it is not necessary to adjust the capacitor to its minimum capacitance value and therefore the rate of change of capacitance can be smaller.

It will be appreciated that the present invention is not restricted to the particular apparatus that has been described and illustrated, and that variations may be made therein without departing from the scope of the invention as defined in the appended claims and equivalents thereof. For example, instead of using the simple comparator 50 that receives a single threshold voltage from the DAC 54 and has two defined output states, it would be possible to use a window comparator that receives two threshold voltages from the DAC 54 and has three defined output states. Use of a window comparator provides the advantage that it is possible to adjust the difference between the threshold values by way of the controller. The comparison could take place in the digital domain, by converting the output signal from the amplifier 30 to digital form and using a digital comparator. Such a digital comparator would have three defined output states depending on the relationship between the digital signals received at its inputs. The size of the window established by the digital comparator could be enlarged through use of at least one "don't care" bit. Moreover, if the active interval of the pulse train is more than one time constant of the probe network, it is possible to obtain the same result as if the active interval of the train were less than one time constant by examining the output of the comparator within one time constant following the first transition of each pulse of the pulse train. It is not necessary that the positive peak value of the output voltage from the amplifier 30 be compared to the threshold voltages if the negative peak of the signal provided by the source 10 in its second operating mode is known and is non-zero. The voltages applied to the input terminal of the probe network by the signal source may be the NAND gate's internal high and low output reference voltages. Other switching means than a NAND gate may be used to provide the desired output signals of the signal source.

It is not necessary to use a peak detector to determine whether the signal input voltage to the comparator is equal to the threshold voltage, since an oscilloscope may be used instead.

I claim:

1. Apparatus for indicating proper compensation of an adjustable frequency compensation network having a predetermined time constant, comprising:
   a signal source operable in a first operating mode to apply a constant voltage to the frequency compensation network for a time longer than one time constant of the frequency compensation network and in a second operating mode to apply rectangular pulse having a preselected peak magnitude and a duration less than said predetermined time constant to the frequency compensation network, and
   measurement means for measuring the peak value of the output voltage of the frequency compensation network when the signal source is in its first operating mode and when the signal source is in its second operating mode and comparing the peak value of the output voltage provided by the frequency compensation network when the signal source is in the first operating mode with the peak output voltage provided by the frequency compensation network when the signal source is in the second operating mode 2. Apparatus according to claim 1, wherein the signal source, when in the second operating mode, applies a train of rectangular pulses to the frequency compensation network, and wherein the period and duty cycle of the pulse train generated by the signal source in its second operating mode are such that the duration of the interval during each repitition for which the output voltage of the signal source is equal to said preselected peak magnitude is less than said predetermined time constant.

3. Apparatus according to claim 1, wherein the measurement means comprise control means for generating a digital output signal, a comparator having a signal input and a threshold input, the signal input being connected to receive a signal having a voltage representative of the output voltage of the frequency compensation network and the comparator being operative to provide an output signal representative of the relationship between the output voltage of the frequency compensation network and a threshold value, and a digital-to-analog converter connected to receive the digital output signal of the control means and generate an analog output signal, the output of the digital-to-analog converter being connected to the threshold input of the comparator and the output of the comparator being connected to the control means.

4. Apparatus according to claim 3, further comprising indicator means connected to said control means for providing a perceptible indication as to whether the frequency compensation network is properly compensated.

5. Apparatus according to claim 1, wherein the signal source comprises a voltage generator for generating a first constant voltage, a gate having a first condition in which it applies said first constant voltage to the frequency compensation network and a second condition in which it applies a second constant voltage to the frequency compensation network, and a gate control circuit for selectively placing the gate in its first condition or its second condition.

6. Apparatus according to claim 5, comprising control means coupled to the gate control circuit for placing the signal source in its first operating mode by placing the gate in its first condition for a time longer than said predetermined time constant and placing the signal source in its second operating mode by first placing the gate in its second condition, then placing the gate in its first condition for a time less than said predetermined time constant, and then placing the gate in its second condition.

7. Apparatus for indicating proper compensation of an adjustable frequency compensation network having a predetermined time constant, comprising:
   a signal source operable to apply a rectangular pulse train having a preselected peak magnitude to the frequency compensation network, and
   comparison means for comparing the output voltage of the frequency compensation network to at least one threshold value and for determining whether, at a time that follows a transition of a pulse of the pulse train by an interval that is less than one time constant of the frequency compensation network, the output voltage of the frequency compensation network bears a predetermined relationship to said threshold value.

8. A method for determining whether an adjustable frequency compensation network having a predetermined time constant is properly compensated, said method comprising:
   applying a preselected voltage to the frequency compensation network for a first interval, said first interval being longer than the predetermined time constant,
   measuring the peak value of the output voltage of the frequency compensation network during said first interval,
   applying a preselected voltage to the frequency compensation netwoark during a second interval, said second interval being shorter than the predetermined time constant,
   measuring the peak value of the output voltage of the frequency compensation network during said second interval, and
   comparing the two measured peak values.

9. A method according to claim 8, wherein the preselected voltage that is applied to the frequency compensation network during the second interval is the same as the preselected voltage that is applied to the frequency compensation network during the first interval, the frequency compensation network includes a variable capacitor, and the method further comprises adjusting the capacitance value of the variable capacitor to achieve equality of the two measured peak values.

* * * * *